US012757552B2

(12) United States Patent
Knoll et al.

(10) Patent No.: US 12,757,552 B2
(45) Date of Patent: Oct. 6, 2026

(54) REFRACTORY COMPOUND AND BINDER THEREFOR, METHOD FOR THE PRODUCTION AND USE THEREOF

(71) Applicant: INTOCAST AG, Ratingen (DE)

(72) Inventors: Manfred Knoll, Melsbach (DE); Natalie Fröse, Oberhausen (DE)

(73) Assignee: INTOCAST AG, Ratingen (DE)

( * ) Notice: Subject to any disclaimer, the term of this patent is extended or adjusted under 35 U.S.C. 154(b) by 1248 days.

(21) Appl. No.: 17/432,403

(22) PCT Filed: Feb. 20, 2020

(86) PCT No.: PCT/EP2020/054551

§ 371 (c)(1),
(2) Date: Aug. 19, 2021

(87) PCT Pub. No.: WO2020/169772

PCT Pub. Date: Aug. 27, 2020

(65) Prior Publication Data

US 2022/0231078 A1 Jul. 21, 2022

(30) Foreign Application Priority Data

Feb. 20, 2019 (DE) ......................... 102019001214.3
Aug. 7, 2019 (DE) ......................... 202019003290.8

(51) Int. Cl.

| | |
|---|---|
| ***H01L 27/15*** | (2006.01) |
| ***C04B 28/24*** | (2006.01) |
| ***C04B 35/101*** | (2006.01) |
| ***C04B 35/624*** | (2006.01) |
| ***C04B 35/626*** | (2006.01) |
| ***C04B 35/63*** | (2006.01) |
| ***C04B 35/66*** | (2006.01) |
| ***H01L 33/62*** | (2010.01) |
| ***H10H 20/857*** | (2025.01) |
| ***H10H 29/14*** | (2025.01) |
| *C04B 111/00* | (2006.01) |

(52) U.S. Cl.

CPC ........... *H10H 29/142* (2025.01); *C04B 28/24* (2013.01); *C04B 35/101* (2013.01); *C04B 35/624* (2013.01); *C04B 35/6263* (2013.01); *C04B 35/62655* (2013.01); *C04B 35/6316* (2013.01); *C04B 35/66* (2013.01); *H10H 20/857* (2025.01); *C04B 2111/00431* (2013.01); *C04B 2235/3206* (2013.01); *C04B 2235/3222* (2013.01); *C04B 2235/3418* (2013.01); *C04B 2235/5212* (2013.01); *C04B 2235/5409* (2013.01); *C04B 2235/5436* (2013.01); *C04B 2235/5463* (2013.01)

(58) Field of Classification Search

CPC .............. C04B 35/101; C04B 35/6263; C04B 35/6316; C04B 2111/00431; C04B 2235/3222; C04B 2235/5436

See application file for complete search history.

(56) References Cited

U.S. PATENT DOCUMENTS

| | | | | |
|---|---|---|---|---|
| 5,214,004 A * | 5/1993 | Bansal | C03C 14/002 | 501/89 |
| 5,283,215 A * | 2/1994 | Hosokawa | C04B 35/443 | 501/109 |
| 6,268,018 B1 | 7/2001 | Langenohl | | |
| 2014/0291904 A1* | 10/2014 | Soudier | F27D 1/0006 | 266/280 |

FOREIGN PATENT DOCUMENTS

| | | | |
|---|---|---|---|
| CN | 106242588 A * | 12/2016 | C04B 35/66 |
| DE | 3002763 A1 | 7/1981 | |
| EP | 2006260 A1 | 12/2008 | |
| JP | S62105968 A * | 5/1987 | |

OTHER PUBLICATIONS

Fruijtier-Pölloth, Claudia. "The toxicological mode of action and the safety of synthetic amorphous silica—A nanostructured material." Toxicology 294.2-3 (2012): 61-79. (Year: 2012).*
CN106242588A machine translation (Year: 2016).*
Https://en.hifull.com/blog/fumed-silica-size-property/ Accessed Apr. 10, 2025 (Year: 2025).*
JPS62105968A machine translation (Year: 1987).*
Darghouth, A., S. Aouida, and B. Bessais. "High purity porous silicon powder synthesis by magnesiothermic reduction of Tunisian silica sand." Silicon 13.3 (2021): 667-676. (Year: 2021).*
Miyaji, Dan Yushin, et al. "Effect of specimen size on the resistance to thermal shock of refractory castables containing eutectic aggregates." Materials Research 18.2 (2015): 250-257. (Year: 2015).*
Int'l. Search Report from priority Int'l. Application No. PCT/EP2020/054551, European Patent Office, Sep. 23, 2020.
R.D. Dos Anjos et al., "Workability and setting parameters evaluation of colloidal silica bonded refractory suspensions," Ceramics Int'l., Oct. 29, 2007, pp. 165-171, vol. 34, No. 1, Elsevier, Amsterdam, NL.
Int'l. Preliminary Report on Patentability and Written Opinion (English translation) from priority Int'l. Application No. PCT/EP2020/054551, European Patent Office, Jul. 8, 2021.

* cited by examiner

*Primary Examiner* — Cameron K Miller
(74) *Attorney, Agent, or Firm* — UB Greensfelder LLP; Brian E. Turung

(57) ABSTRACT

The invention relates to an unshaped refractory compound, in particular, a casting compound, gunning compound and/or free-flowing compound, comprising a bond system which forms upon addition of water, and a dry micro-scale amorphous $SiO_2$- binder as the sole binder, which is mixed in a proportion of ≤1% by weight of the total mass with the solid components to be bonded and forms the bond system after additional of 1-30% by weight of water. The invention further relates to a method for producing refractory compounds and a use of microcrystalline amorphous silicon dioxide in the production of refractory compounds.

18 Claims, No Drawings

REFRACTORY COMPOUND AND BINDER THEREFOR, METHOD FOR THE PRODUCTION AND USE THEREOF

PRIORITY INFORMATION

The present invention is a national stage application of International Application Serial No. PCT/EP2020/054551, filed Feb. 20, 2020, which in turn claims priority to German Application Serial No. 10 2019 001 214.3, filed Feb. 20, 2019 and German Application Serial No. 20 2019 003 290.8, filed Aug. 7, 2019, all of which are incorporated herein by reference.

FIELD OF THE INVENTION

The invention relates to a refractory mass, a binder therefor, a method for the production of a refractory mass and of a bonding system and a use of microscale amorphous silicon dioxide.

High-alumina cements are considered to be the most widely used conventional binders in unshaped refractory products. The binder is activated by the calcium aluminates contained in these cements by the addition of water.

In recent years, however, more and more silica sol solutions have been used as the binder. Silica sol solutions are aqueous, colloidal dispersions of nanoscale amorphous silicon dioxide particles. The refractory products which are bonded with this are characterized by good alkali and acid resistance compared with cement-bonded masses.

Compared with cement-bonded compounds, because of the missing hydrate phases, silica sol-bonded materials can be heated up quickly, resulting in a significant saving in energy and therefore in costs.

One disadvantage of these binders, however, is that they have to be stored in separate containers and protected from frost and light. Because of the sensitivity to frost, special heating devices have to be installed.

Alternatively, microscale amorphous silicon dioxide can be admixed as a dry powder with the remaining components of the mass, so that a silica gel is formed when water is added to the entire mass.

DE 41 09 916 A1 discloses a refractory mortar in which a mixture comprising a phosphate, clay and lignin sulphonate is used as the binder.

In DE 10 2014 019 351 A1, tar, pitch and resin are used as the main binder components.

The bonding systems in DE 27 39 767 A1, EP 0 842 910 A2 and DE 30 02 763 A1 are based on clays with the addition of a phosphoric acid/hydrochloric acid, as well as on water glass/liquid silica sol.

DESCRIPTION OF THE INVENTION

Thus, from the foregoing, the objective of the invention is to provide an improved refractory mass with an improved bonding system, a method for the production of each and a use of microscale amorphous silicon dioxide.

This objective is achieved by an improved refractory mass with an improved bonding system.

Firstly, the invention proposes the use of small quantities (in particular ≤1% by weight or 0.1-1% by weight) of a microscale amorphous silicon dioxide as the only binder for the production of bonding in unshaped refractory materials.

When using a conventional refractory concrete, in which any presence of cement phases (calcium aluminates) could constitute a problem (such as in SiC-based combustion aids, for example), advantageously, a microscale $SiO_2$ system is used in order to produce the bonding instead of water-containing cement phases. This may, for example, be carried out by making use of silica sol solutions. In this regard, the mass to be bonded is admixed with the silica sol solution, processed and allowed to cure. As an alternative, microscale amorphous $SiO_2$ may be mixed with the remaining components of the mass as a dry powder, so that when water is added to the entire mass, a silica gel is formed in the mass. The advantage of this procedure is that no silica sol solution, the reactivity of which is influenced by aging processes as well as storage conditions, has to be provided separately.

In accordance with the invention, a bonding system is produced by dispersing microscale amorphous oxide of silicon under the action of water; the bonding system can be used to produce a binder in unshaped refractory products.

The microscale $SiO_2$ used to produce the bonding is a product which can be obtained as an amorphous precipitate by means of a precipitation reaction and which has a purity of approximately 90-99.9% by weight (in the dry state), a mean grain size in the micrometer range (1-50 μm, in particular 1-10 μm, 1-20 μm, 1-30 μm or 1-40 μm), as well as a specific surface area of approximately 50-350 $m^2/g$, in particular 100-350 $m^2/g$, 200-350 $m^2/g$, or 250-300 $m^2/g$.

The large specific surface area of the material causes rapid hydration upon mixing of the microscale amorphous $SiO_2$ with water, with the formation of a silica gel. Silica gels contain $(H_2SiO_5)_x$ units which are held together via Van-der-Waals bonds and hydrogen bonds and between which particles of other chemical compositions and different grain sizes may be included. Upon drying the gel, a $SiO_2$ framework remains which can furthermore encompass the grains which are introduced.

The method in accordance with the invention concerns the production of a $SiO_2$ bonding system by the use of a dry $SiO_2$ binder which is mixed with the solid components to be bonded in a proportion of ≤1% by weight, in particular 0.1-1% by weight of the total mass and is used to produce the bonding after the addition of approximately 1-30% by weight, in particular 1-10% by weight, 10-30% by weight, 15-30% by weight or 20-30% by weight of water.

The rate of hydration of the $SiO_2$, the coagulation to form the silica gel and the subsequent dehydration of the gel is dependent upon the temperature, pH, material composition and material thickness.

However, the microscale $SiO_2$-based bonding system has a significantly lower reaction dependency as regards the temperature and the chemical composition when in the form of cement-bonded bonding systems. Thus, the binder may be used for the production of a plurality of refractory masses with different raw material compositions for spraying, vibration, self-flow or casting masses.

Usually, after they have been cast into cylinders and dried at 110° C., alternatively at 100-150° C., or 105-125° C., the refractory materials produced in accordance with the invention have a compressive strength of >15 MPa. Because of the low spalling tendency of silica gels compared with calcium aluminate hydrate phases, the products produced with microscale $SiO_2$ binders have the advantage of being capable of being heated more rapidly without damage.

Example 1, for Refractory Masses (Quantities as a % by Weight)

| | |
|---|---|
| Aluminum oxide (0-6 mm) | 80-95% |
| Spinel (0-3 mm) | 5-20% |

-continued

| | |
|---|---|
| MgO, ultrafine | <1%, in particular 0.1% to 1% |
| Microscale amorphous $SiO_2$ | <1%, in particular 0.1% to 1% |
| Synthetic polyelectrolyte | <1%, in particular 0.1% to 1% |
| PE fibers | <1%, in particular 0.1% to 1% |

Example 2, for Refractory Masses (Quantities as a % by Weight)

| | |
|---|---|
| Aluminum oxide (0-6 mm) | 90-99% |
| MgO, ultrafine | <1%, in particular 0.1% to 1% |
| Microscale amorphous $SiO_2$ | <1%, in particular 0.1% to 1% |
| Synthetic polyelectrolyte | <1%, in particular 0.1% to 1% |
| PE fibers | <1%, in particular 0.1% to 1% |

Further embodiments are defined in the dependent claims.

Further embodiments are an unshaped refractory mass comprising one or more of the following main components or combinations thereof: up to 99.5% of $Al_2O_3$ support of various types and granulometries, for example fused corundum, tabular alumina, andalusite, fireclay, bauxite, mullite, various secondary raw materials. SiC, MgO, quartz, $SiO_2$, olivine, and up to 5% by weight of a plasticizer, up to 15% by weight of a curing accelerator, up to 15% by weight of a curing retardant, up to 1% by weight of a microscale amorphous powdered $SiO_2$. The refractory mass can comprise a bonding system which is produced by the addition of water, characterized by a dry microscale amorphous $SiO_2$ binder as the only binder, which is admixed in a proportion of ≤1% by weight of the total mass with the solid components to be bonded and the bonding system is produced following the addition of 1-30% by weight of water. The microscale $SiO_2$ can be obtained as an amorphous precipitate by means of a precipitation reaction and has a purity of >90%, >95%, >98% or >99% by weight (in the dry state), a mean grain size in the micrometer region (10-50 μm) and/or a specific surface area of approximately 100-300 $m^2/g$. The refractory mass by the formation of a silica gel with $(H_2SiO_5)_x$ units which are held together via Van-der-Waals bonds and hydrogen bonds and between which particles of other chemical compositions and different grain sizes may be included. A binder for a refractory mass can contain $SiO_2$ and the $SiO_2$ is a dry powder and the only binder. The $SiO_2$ can be formed with a purity of >90%, >95%, >98% or >99% by weight (in the dry state), and/or with a mean grain size in the micrometer region (1-50 μm) and/or with a specific surface area of approximately 50-350 $m^2/g$. A method can be provided for the production of refractory masses, characterized by adding a $SiO_2$ binder as the only binder for the production of bonding, to a composition for a refractory mass, wherein the $SiO_2$ is added as a dry powder. The method can include dispersing microscale amorphous powdered oxide of silicon in water in order to produce a bonding system for refractory materials. The method can include that the $SiO_2$ used for the production of bonding is obtained as an amorphous precipitate by means of a precipitation reaction and has a purity of >90%>95%, >98% or >99% by weight (in the dry state), a mean grain size in the micrometer region (1-50 μm) and/or a specific surface area of approximately 50-350 $m^2/g$. The method can include the formation of a silica gel with $(H_2SiO_5)_x$ units which are held together via Van-der-Waals bonds and hydrogen bonds and between which particles of other chemical compositions and different grain sizes may be included.

The method can include that after drying the gel, a $SiO_2$ framework remains which furthermore encompasses the grains which have been introduced. A method for the production of a $SiO_2$ bonding system can be provided by using a dry microscale amorphous $SiO_2$ binder which is admixed with the solid components to be bonded in a proportion of ≤1% by weight of the total mass and is used as the only binder for the production of bonding following the addition of approximately 1-30% by weight of water. The use of ≤1% by weight of a powdered microscale amorphous silicon dioxide can be the only binder in the production of a refractory mass for the production of bonding in unshaped materials.

What is claimed is:

1. An unshaped refractory mass comprising:

$Al_2O_3$; said $Al_2O_3$ constitutes up to 99.5 wt. % of said unshaped refractory mass; a source of said $Al_2O_3$ includes a source selected from one or more of fused corundum, tabular alumina, andalusite, fireclay, bauxite, mullite, quartz, and olivine;

plasticizer; said plasticizer constitutes up to 5% by weight of said unshaped refractory mass;

curing accelerator; said curing accelerator constitutes up to 15% by weight of said unshaped refractory mass;

curing retardant; said curing retardant constitutes up to 15% by weight of said unshaped refractory mass;

microscale amorphous powdered $SiO_2$; said microscale amorphous powdered $SiO_2$ constitutes up to 1% by weight of said unshaped refractory mass; said microscale amorphous powdered $SiO_2$ has a purity of 90-99.9% by weight (in a dry state), a mean grain size of 1-50 μm, and a specific surface area of 50-350 $m^2/g$; and a binder comprising microscale amorphous powdered $SiO_2$ and water, wherein said microscale amorphous powdered $SiO_2$ and water are the only binders for said unshaped refractory mass and additional additive; said additional additive includes two or more compounds selected from the group consisting of spinel, MgO, synthetic polyelectrolyte and PE fibers.

2. The refractory mass as claimed in claim 1, characterized in that the microscale amorphous powdered $SiO_2$ is obtained as an amorphous precipitate by means of a precipitation reaction and has said purity of >95% by weight (in the dry state), said mean grain size 10-50 μm and said specific surface area of 100-300 $m^2/g$.

3. The refractory mass as claimed in claim 1, characterized by the formation of a silica gel with $(H_2SiO_5)_x$ units which are held together via Van-der-Waals bonds and hydrogen bonds and between which particles of other chemical compositions and different grain sizes may be included.

4. The refractory mass as claimed in claim 1, characterized by the binder is $SiO_2$ and is formed with said purity of >95% by weight (in the dry state), and with said mean grain size of 1-50 μm and with said specific surface area of 50-350 $m^2/g$.

5. An unshaped refractory mass comprising:

80-99.5 wt. % $Al_2O_3$;

0.1-1 wt. % microscale amorphous $SiO_2$;

up to 5 wt. % plasticizer;

up to 15 wt. % curing accelerator;

up to 15 wt. % curing retardant; and additional additive; said additional additive includes spinel and one or more compounds selected from the group consisting of, MgO, synthetic polyelectrolyte and PE fibers; and a binder comprising microscale amorphous $SiO_2$ and water, wherein said microscale amorphous $SiO_2$ and water are the only binders for said unshaped refractory mass.

6. The unshaped refractory mass as defined in claim 5, wherein said microscale amorphous $SiO_2$ has a mean grain size of 1-50 μm and a specific surface area of 50-350 $m^2/g$.

7. The unshaped refractory mass as defined in claim 5, comprising:

80-99.5 wt. % $Al_2O_3$;

0.1-1 wt. % microscale amorphous $SiO_2$;

up to 5 wt. % plasticizer;

up to 15 wt. % curing accelerator;

up to 15 wt. % curing retardant;

MgO<1 wt. %;

Synthetic polyelectrolyte<1 wt. %; and

PE fibers<1 wt. %.

8. An unshaped refractory mass comprising 80-99.5 wt. % $Al_2O_3$; 0.1-1 wt. % microscale amorphous $SiO_2$, said microscale amorphous $SiO_2$ has a mean grain size of 1-50 μm and a specific surface area of 50-350 $m^2/g$; up to 5 wt. % plasticizer; up to 15 wt. % curing accelerator; up to 15 wt. % curing retardant; and additional additive; said additional additive includes spinel and one or more compounds selected from the group consisting of a) MgO and wherein a maximum content of said MgO is 1 wt. % of said unshaped refractory mass, b) synthetic polyelectrolyte and wherein a maximum content of said synthetic polyelectrolyte is up to 1 wt. % of said unshaped refractory mass, and c) PE fibers and wherein a maximum content of said PE fibers is up to 1 wt. % of said unshaped refractory mass, and wherein a maximum content of said spinel is up to 20 wt. % of said unshaped refractory mass; and a binder comprising microscale amorphous $SiO_2$ and water, wherein said microscale amorphous $SiO_2$ and water are the only binders for said unshaped refractory mass.

9. The unshaped refractory mass as defined in claim 8, wherein said unshaped refractory mass comprises:

| | |
|---|---|
| $Al_2O_3$ | 80-95 wt. %; |
| Microscale amorphous $SiO_2$ | 0.1-1 wt. %; |
| Spinel | 5-20 wt. %; |
| MgO | 0.1-1 wt. %; |
| Synthetic polyelectrolyte | 0.1-1 wt. %; |
| PE fibers | 0.1-1 wt. %; |
| Plasticizer | up to 5 wt. %; |
| Curing Accelerator | up to 15 wt. %; and |
| Curing Retardant | up to 15 wt. %. |

10. The unshaped refractory mass as defined in claim 8, wherein said unshaped refractory mass comprises:

| | |
|---|---|
| $Al_2O_3$ | 90-99 wt. %; |
| Microscale amorphous $SiO_2$ | 0.1-1 wt. %; |
| MgO | 0.1-1 wt. %; |
| Synthetic polyelectrolyte | 0.1-1 wt. %; and |
| PE fibers | 0.1-1 wt. %. |

11. A refractory mass composition that is formulated to be combined with water to form a binding system; said refractory mass composition comprises:

80-99.5 wt. % $Al_2O_3$;

0.1-1 wt. % microscale amorphous $SiO_2$, said microscale amorphous $SiO_2$ has a mean grain size of 1-50 μm and a specific surface area of 50-350 $m^2/g$; and additional additive; said additional additive includes two or more compounds selected from the group consisting of a) MgO and wherein a maximum content of said MgO is 1 wt. % of said refractory mass composition, b) synthetic polyelectrolyte and wherein a maximum content of said synthetic polyelectrolyte is up to 1 wt. % of said refractory mass composition, c) PE fibers and wherein a maximum content of said PE fibers is up to 1 wt. % of said refractory mass composition, and d) spinel and maximum content of said spinel is up to 20 wt. % of said refractory mass composition; and a binder comprising microscale amorphous $SiO_2$ and water, wherein said microscale amorphous $SiO_2$ and water are the only binders for said unshaped refractory mass.

12. The refractory mass composition as defined in claim 11, wherein said additional additive includes three or more compounds selected from the group consisting of a) MgO and wherein a maximum content of said MgO is 1 wt. % of said refractory mass composition, b) synthetic polyelectrolyte and wherein a maximum content of said synthetic polyelectrolyte is up to 1 wt. % of said refractory mass composition, c) PE fibers and wherein a maximum content of said PE fibers is up to 1 wt. % of said refractory mass composition, and d) spinel and maximum content of said spinel is up to 20 wt. % of said refractory mass composition.

13. The refractory mass composition as defined in claim 11, wherein said additional additive includes a) MgO and wherein a maximum content of said MgO is 1 wt. % of said refractory mass composition, b) synthetic polyelectrolyte and wherein a maximum content of said synthetic polyelectrolyte is up to 1 wt. % of said refractory mass composition, c) PE fibers and wherein a maximum content of said PE fibers is up to 1 wt. % of said refractory mass composition, and d) spinel and maximum content of said spinel is up to 20 wt. % of said refractory mass composition.

14. The refractory mass composition as defined in claim 11, wherein said refractory mass composition is used as a binder component for a solid components to form a bonded mass; said bonded mass after said refractory mass composition has been added includes 0.1-1 wt. % refractory mass composition, 1-30 wt. % water and the balance solid components.

15. The refractory mass composition as defined in claim 12, wherein said refractory mass composition is used as a binder component for a solid components to form a bonded mass; said bonded mass after said refractory mass composition has been added includes 0.1-1 wt. % refractory mass composition, 1-30 wt. % water and the balance solid components.

16. The refractory mass composition as defined in claim 13, wherein said refractory mass composition is used as a binder component for a solid components to form a bonded mass; said bonded mass after said refractory mass composition has been added includes 0.1-1 wt. % refractory mass composition, 1-30 wt. % water and the balance solid components.

17. The refractory mass composition as defined in claim 11, further including one or more of a) plasticizer and wherein said plasticizer constitutes up to 5 wt. % of said refractory mass composition, b) curing accelerator and wherein said curing accelerator constitutes up to 15 wt. % of said refractory mass composition, and c) curing retardant and wherein said curing retardant constitutes up to 15 wt. % of said refractory mass composition.

18. The refractory mass composition as defined in claim 16, further including one or more of a) plasticizer and wherein said plasticizer constitutes up to 5 wt. % of said refractory mass composition, b) curing accelerator and wherein said curing accelerator constitutes up to 15 wt. % of said refractory mass composition, and c) curing retardant and wherein said curing retardant constitutes up to 15 wt. % of said refractory mass composition.

* * * * *